United States Patent
Kim (10) Patent No.: US 8,378,380 B2
(45) Date of Patent: Feb. 19, 2013

(54) NITRIDE SEMICONDUCTOR LIGHT-EMITTING DEVICE AND METHOD FOR MANUFACTURING THE SAME

(75) Inventor: Tae Yun Kim, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 199 days.

(21) Appl. No.: 11/681,478

(22) Filed: Mar. 2, 2007

(65) Prior Publication Data

US 2007/0205429 A1 Sep. 6, 2007

(30) Foreign Application Priority Data

Mar. 5, 2006 (KR) .................... 10-2006-0020741

(51) Int. Cl.
*H01L 33/00* (2010.01)
(52) U.S. Cl. .......................... 257/103; 257/79
(58) Field of Classification Search .................. 257/13, 257/79–103, 918, E51.018–E51.022, E33.001–E33.077, 257/E25.028, E25.032; 438/22–47, 69, 493, 438/503, 507, 956
See application file for complete search history.

(56) References Cited

U.S. PATENT DOCUMENTS

| | | | | |
|---|---|---|---|---|
| 5,677,923 A * | 10/1997 | Rice et al. | ......... | 372/74 |
| 6,091,195 A * | 7/2000 | Forrest et al. | ......... | 313/504 |
| 6,623,998 B2 * | 9/2003 | Asami et al. | ......... | 438/22 |
| 6,744,074 B2 * | 6/2004 | Horie et al. | ......... | 257/88 |
| 6,969,946 B2 | 11/2005 | Steranka et al. | | |
| 6,984,841 B2 * | 1/2006 | Tsuda et al. | ......... | 257/12 |
| 7,271,020 B2 * | 9/2007 | Wu et al. | ......... | 438/26 |
| 2004/0140474 A1 * | 7/2004 | Ueda et al. | ......... | 257/79 |
| 2005/0133796 A1 * | 6/2005 | Seo et al. | ......... | 257/79 |
| 2005/0167682 A1 * | 8/2005 | Fukasawa | ......... | 257/79 |
| 2005/0179130 A1 * | 8/2005 | Tanaka et al. | ......... | 257/730 |
| 2006/0220040 A1 * | 10/2006 | Suzuki | ......... | 257/89 |
| 2006/0226431 A1 | 10/2006 | Lee et al. | | |
| 2006/0231852 A1 * | 10/2006 | Kususe et al. | ......... | 257/99 |
| 2006/0292804 A1 | 12/2006 | Seo et al. | | |

FOREIGN PATENT DOCUMENTS

| | | | |
|---|---|---|---|
| JP | 2004-153277 A | | 5/2004 |
| JP | 2005-223082 | * | 8/2005 |
| KR | 10-2002-0021247 A | | 3/2002 |
| KR | 10-2005-0038207 A | | 4/2005 |
| KR | 10-2005-0063925 A | | 6/2005 |
| WO | WO-02/23640 A1 | | 3/2002 |

OTHER PUBLICATIONS

Notice of Allowance dated Nov. 18, 2011 in Korean Application No. 10-2006-0020741, filed Mar. 5, 2006.
Notice of Allowance dated May 31, 2012 in Korean Application No. 10-2006-0020741, filed Mar. 5, 2006.

* cited by examiner

*Primary Examiner* — Wael Fahmy
*Assistant Examiner* — Sue Tang
(74) *Attorney, Agent, or Firm* — Saliwanchik, Lloyd & Eisenschenk (57) ABSTRACT

Provided are a nitride semiconductor light-emitting device and a method for manufacturing the same, capable of improving light emitting efficiency by forming a reflection layer on a lateral side of an LED chip. An embodiment provides a nitride semiconductor light-emitting device includes a light-emitting device chip and a reflection layer. The reflection layer is formed on a lateral side of the light-emitting device chip.

20 Claims, 8 Drawing Sheets

NITRIDE SEMICONDUCTOR LIGHT-EMITTING DEVICE AND METHOD FOR MANUFACTURING THE SAME

CROSS-REFERENCE TO RELATED APPLICATION

The present application claims priority under 35 U.S.C. 119 to Korean Patent Application No. 10-2006-0020741, filed on Mar. 5, 2006, which is hereby incorporated by reference in its entirety.

BACKGROUND OF THE INVENTION

1. Field of the Invention

An embodiment of the present invention relates to a nitride semiconductor light-emitting device and a method for manufacturing the same.

2. Description of the Related Art

An example of a related art nitride semiconductor includes a GaN-based nitride semiconductor. The GaN-based nitride semiconductor is utilized in optical devices of blue/green light-emitting diodes (LEDs), and high speed switching and high power devices such as metal oxide semiconductor field effect transistors (MOSFETs) and high electron mobility transistors (HEMT) also called hetero junction field effect transistors (HFET).

Particularly, a semiconductor light-emitting device having a crystal layer where a Ga position of a GaN-based nitride semiconductor is doped with an element of group II such as Mg and Zn is in the limelight as a device for emitting blue light in the field of light-emitting devices such as LEDs and semiconductor laser diodes of GaN-based nitride semiconductor applications.

Figure 1:
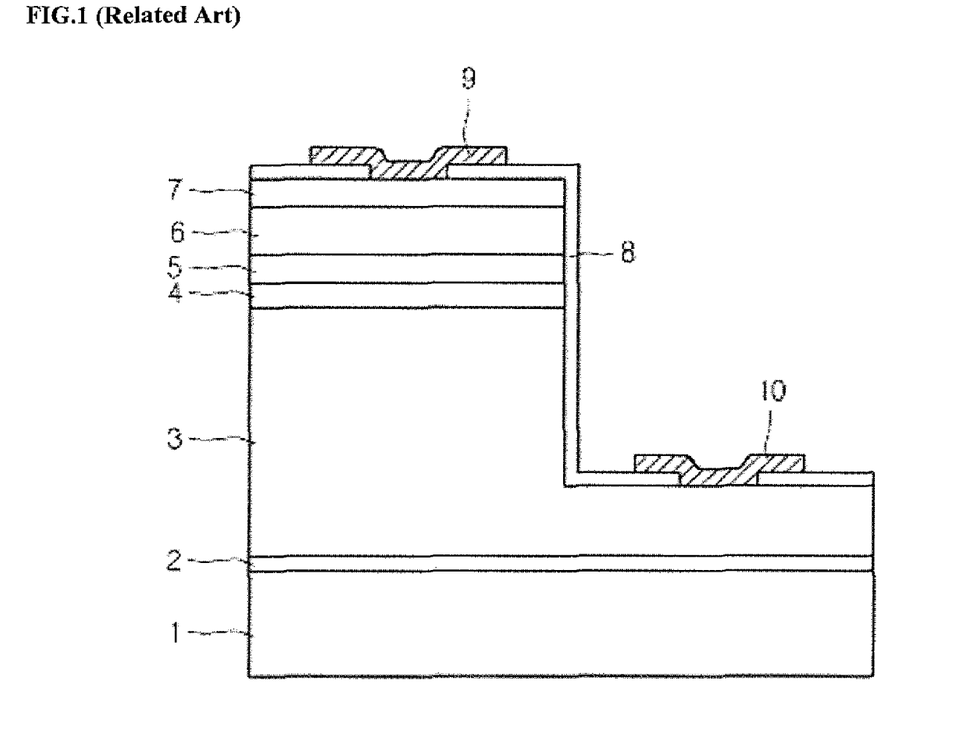
FIG. 1 is a cross-sectional view of a nitride semiconductor light-emitting device according to a related art.

The GaN-based nitride semiconductor can be a light-emitting device having a multiple quantum well structure, for example, as illustrated in FIG. 1. The light-emitting device is grown on a substrate 1 primarily formed of sapphire or SiC. Also, a polycrystal thin layer formed of, for example, an AlGaN layer is grown as a buffer layer 2 on the substrate 1 of sapphire or SiC at a low growing temperature, and then a GaN underlayer 3 is sequentially stacked on the buffer layer 2 at high temperature.

An active layer 4 for emitting light is disposed on the GaN underlayer 3. An AlGaN electron barrier layer 5 doped with Mg converted into a p-type layer by thermal annealing, an InGaN layer 6 doped with Mg, and a GaN layer 7 doped with Mg are sequentially stacked on the active layer 4.

Also, an insulating layer 8 is formed on the GaN layer 7 doped with Mg and the GaN underlayer 3. A p-type electrode 9 and an n-type electrode 10 are formed on the GaN layer 7 and the GaN underlayer 3, respectively, so that a light-emitting device is formed.

Figure 2:
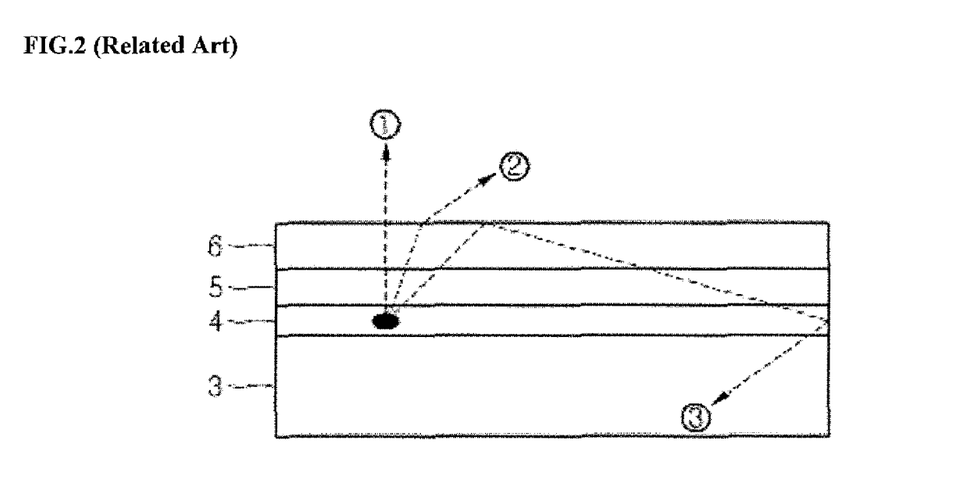
FIG. 2 is a view illustrating light paths of a nitride semiconductor light-emitting device according to a related art.

Referring to FIG. 2, light emitted at the active layer 4 propagates through a light path such as ④, ②, and ③. Here, the light path ③ is a path corresponding to total internal reflection where light is totally reflected at a boundary between materials when light is incident from a material having a large refractive index to a material having a small refractive index and the light is incident at an angle equal to or greater than a predetermined angle (i.e., a critical angle).

Therefore, according to the above described related art nitride semiconductor light-emitting device, a portion of light generated at the active layer 4 that propagates through the light path ③ is absorbed while it is delivered to a lower side or a lateral side. Accordingly, light-emitting efficiency of the light emitting device including the active layer 4 is considerably reduced.

SUMMARY OF THE INVENTION

An embodiment of the present invention is directed to a nitride semiconductor light-emitting device and a method for manufacturing the same that addresses and/or substantially obviates one or more problems due to limitations and disadvantages of the related art.

An embodiment of the present invention provides a nitride semiconductor light-emitting device and a method for manufacturing the same, capable of improving light emitting efficiency by forming a reflection layer on a lateral side of an LED chip.

Also, an embodiment of the present invention provides a nitride semiconductor light-emitting device and a method for manufacturing the same, capable of improving light emitting efficiency using a reflection layer formed on both sides of an LED chip where patterns are formed on a substrate, or an LED chip where patterns are not formed on a substrate.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

An embodiment of the present invention provides a nitride semiconductor light-emitting device including: a light-emitting device chip; and a reflection layer on a lateral side of the light-emitting device chip.

Another embodiment of the present invention provides a method for manufacturing a nitride semiconductor light-emitting device, the method including: forming a light-emitting device chip bar; and forming a first reflection layer on a lateral side of the light-emitting device chip bar.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

It will be understood that when a layer is referred to as being "on/under" another layer or substrate, it can be directly on/under the other layer or substrate, or intervening layers may also be present.

A nitride semiconductor light-emitting device according to an embodiment of the present invention is utilized in an npn type light-emitting device having a MQW structure, but not limited thereto.

First Embodiment

FIGS. 3A to 3F are cross-sectional views for explaining a method for manufacturing a nitride semiconductor according to a first embodiment of the present invention.

Figure 3A:
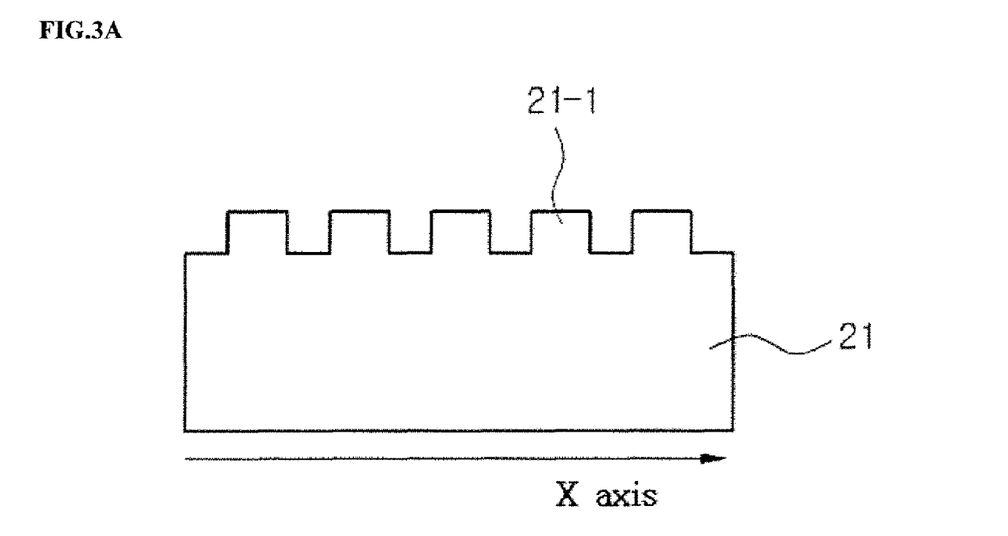
FIGS. 3A to 3F are cross-sectional views for explaining a method for manufacturing a nitride semiconductor according to a first embodiment of the present invention.

First, FIG. 3A is a cross-sectional view of a substrate. The substrate 21 can be, for example, a Si substrate, a sapphire substrate, or a SiC substrate. Predetermined patterns 21-1 can be formed in the substrate along an x-axis direction. Although surface unevenness patterns having a stripe shape are described below as an embodiment, the surface unevenness patterns are not limited thereto. For example, surface unevenness patterns having a lens shape can be used. In an embodiment, surface unevenness patterns 21-1 having a stripe shape can be formed using photolithography and etching. In a specific embodiment, the surface unevenness of the surface unevenness patterns 21-1 can have a width of about 5 μm, and a height or depth of about 1-2 μm.

Figure 3B:
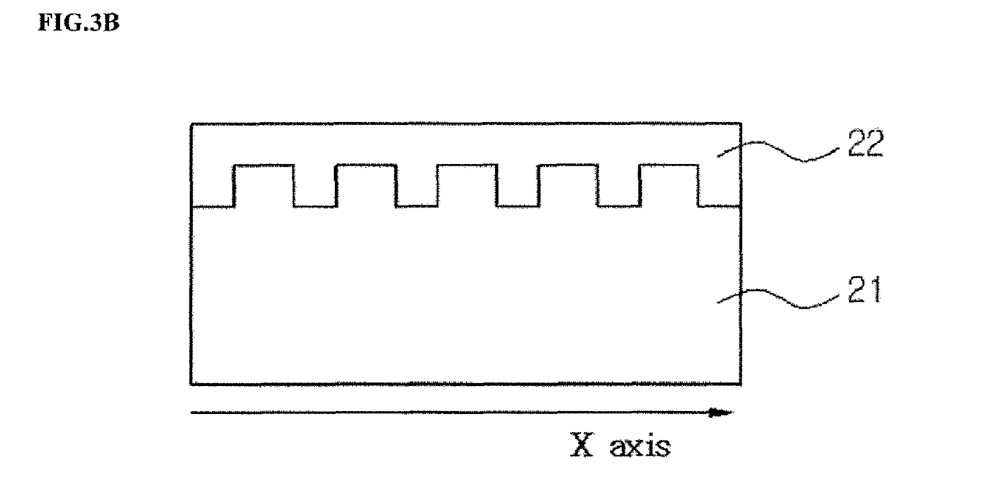

Next, referring to FIG. 3B, a buffer layer 22 is formed on the substrate 21. For example, the buffer layer 22 can be formed by mounting the substrate 21 on a metal organic chemical vapor deposition (MOCVD) reactor (not shown) and growing a GaN layer at a growth temperature of hundreds of degrees Celsius.

Figure 3C:
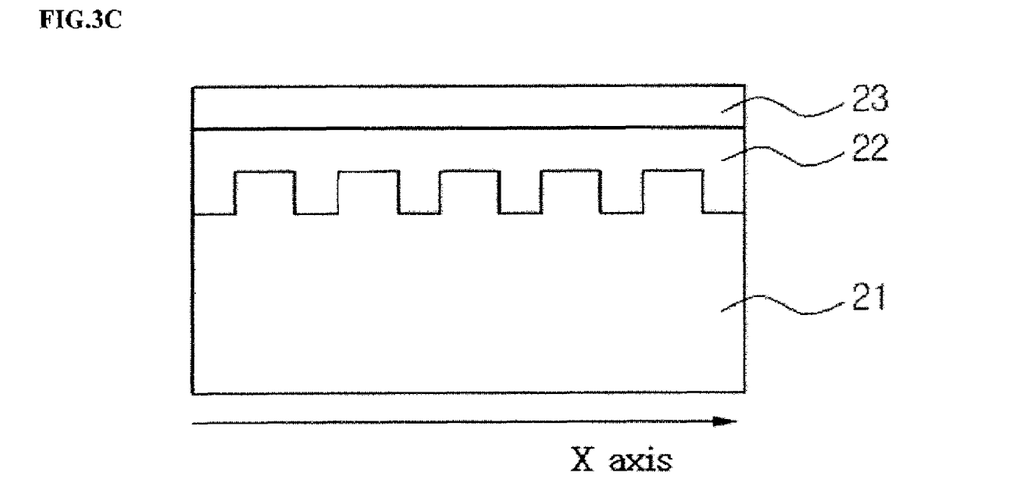

Subsequently, referring to FIG. 3C, a first semiconductor layer 23 is formed on the buffer layer 22. For example, the first semiconductor layer 23 can be grown as an n-type nitride layer, such as a GaN layer, by supplying a silan gas containing an n-type dopant such as $NH_3$, TMGa, or Si on the buffer layer 22.

Figure 3D:
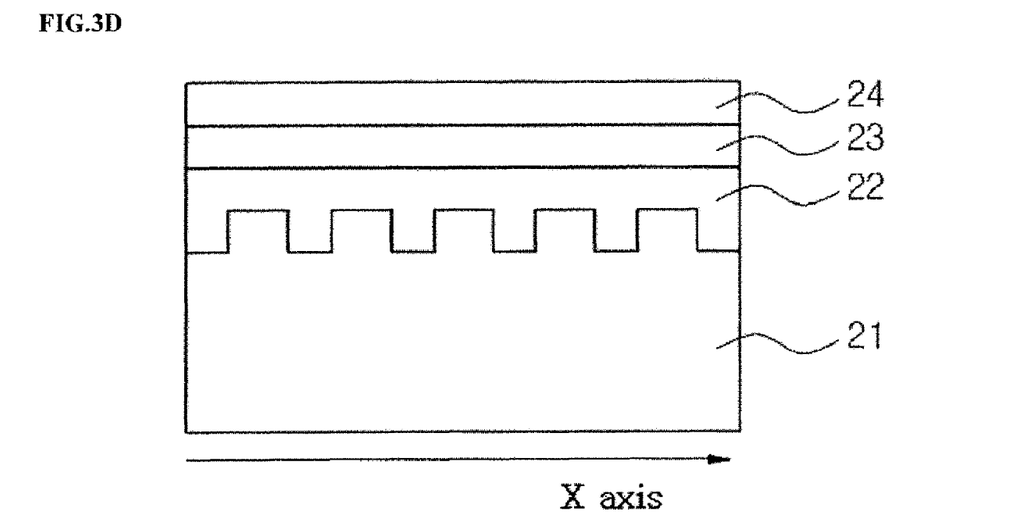

Next, referring to FIG. 3D, an active layer 24 is formed on the first semiconductor layer 23. For example, the active layer 24 can be formed as an InGaN layer by supplying $NH_3$, TMGa, and TMIn using a nitrogen gas as a carrier gas at a growth temperature of about 700-850° C. At this point, the active layer 24 can have a stacked structure formed by growing respective elements at different mol ratios. For example, the active layer 24 can have a stacked structure formed with different contents of In in InGaN.

Figure 3E:
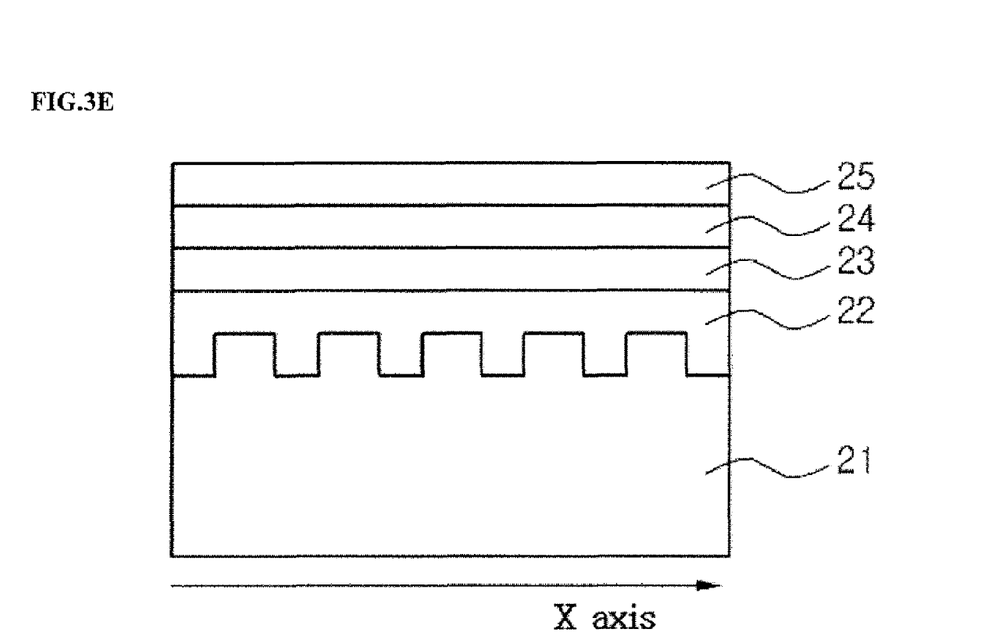

Next, referring to FIG. 3E, a second semiconductor layer 25 is formed on the active layer 24. For example, the second semiconductor layer 25 can be formed as a p-type nitride layer, such as an AlGaN layer, by supplying TMGa, TMAl, EtCp2Mg{$Mg(C_2H_5C_5H_4)_2$}, and $NH_3$ using a hydrogen gas as a carrier gas at an atmosphere temperature of about 900-1100° C.

Figure 3F:
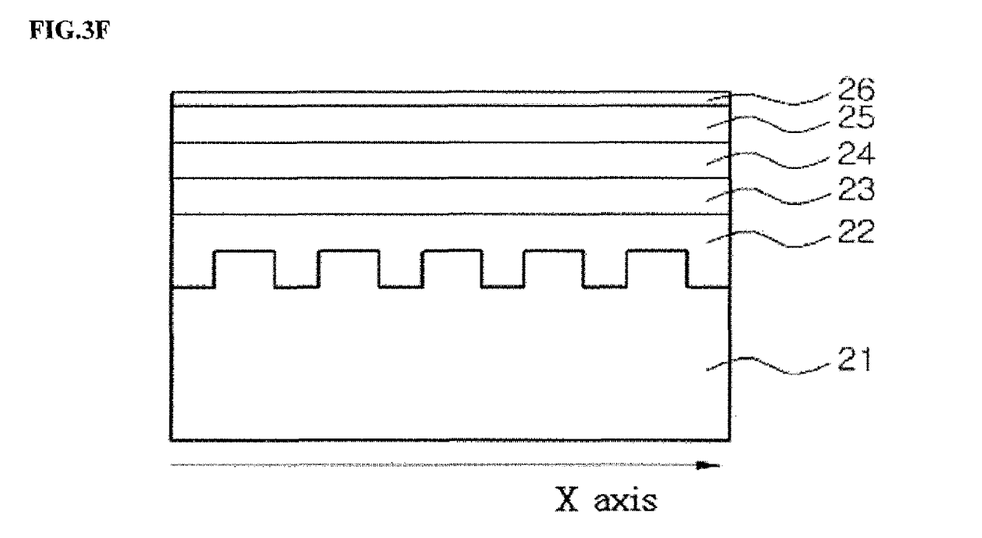

Next, referring to FIG. 3F, a third semiconductor layer 26 is formed on the second semiconductor layer 25. For example, the third semiconductor layer 26 can be formed through a thermal annealing process at a temperature range of about 500-900° C. such that the second semiconductor layer 25 has maximum hole concentration. In one embodiment, a silan gas containing n-type dopants can be supplied to grow the third semiconductor layer 26 as a thin n-type GaN layer on the second semiconductor layer 25.

The nitride semiconductor light-emitting device according to the first embodiment of the present invention can be manufactured in an npn junction structure or in a pn junction structure where the third semiconductor layer is not present depending on a semiconductor layer stacked on the substrate.

Also although not shown in FIG. 3F, electrodes are formed on the first semiconductor layer 23 and the third semiconductor layer 26, respectively. For example, when the third semiconductor layer 26 is formed, wet etching, e.g., anisotropic wet etching can be performed to expose a portion of the first semiconductor layer 23, so that an n-type electrode 33 is realized.

An n-type electrode 33 formed of Ti can be formed on the exposed portion of the first semiconductor layer 23. In addition, a p-type electrode 32 is formed on the third semiconductor layer 26. Here, the p-type electrode 32 can be a transparent electrode formed of ITO, ZnO, $RuO_x$, $TiO_x$, or $IrO_x$.

Figure 4:
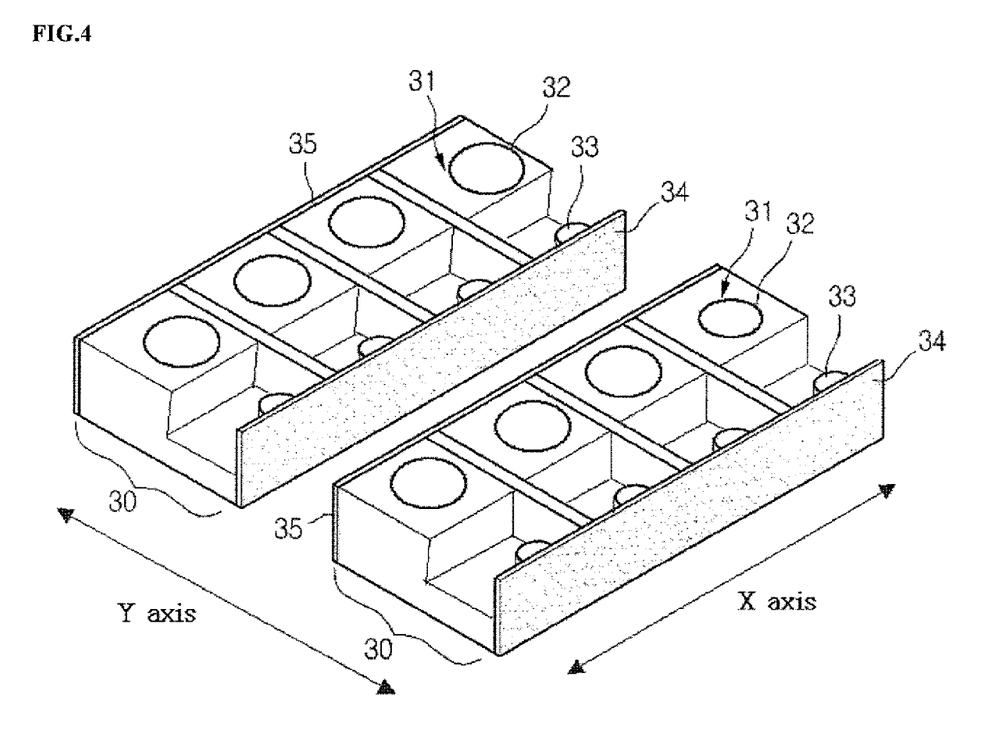
FIG. 4 is a perspective view of a nitride semiconductor light-emitting device according to the first embodiment of the present invention.

FIG. 4 is a perspective view of a nitride semiconductor light-emitting device according to the first embodiment of the present invention.

Referring to FIG. 4, the n-type electrode 33 is formed on the first semiconductor layer 23. The p-type electrode 32 is formed on the third semiconductor layer 26. After the p-type and n-type electrodes 32 and 33 are formed on the substrate, the substrate can be separated by a size unit of an LED chip bar 30. The LED chip substrate can be separated into a plurality of LED chip bars 30 through scribing and breaking processes. A plurality of LED chips 31 are arranged in the LED chip bar 30 along an x-axis direction.

Also, reflection layers 34 and 35 can be formed on both sides of a separated LED chip bar 30 in an x-axis direction. These reflection layers 34 and 35 reflect a portion of light generated from the active layer 24 that propagates to a lateral side of the LED chip 31, so that light is emitted through the p-type electrode 32. Consequently, light loss to the lateral side of the LED is minimized and light emitting efficiency can be maximized.

Here, each of the reflection layers 34 and 35 can be a compound semiconductor layer based on a material having high reflection efficiency such as $Al_xIn_yGaN$ ($0 \leq x \leq 1$, $0 \leq y \leq 1$). The reflection layer can be formed by depositing an $Al_xIn_yGaN$ layer ($0 \leq x \leq 1$, $0 \leq y \leq 1$) and a GaN layer in turns a number of times on at least one side of the LED chip bar 30 using chemical vapor deposition (CVD).

Also, in the case where the reflection layers 34 and 35 are formed of a compound semiconductor layer, desired reflectance can be obtained by controlling the thicknesses of the reflection layers 34 and 35, and the number of stacked layers. In a preferred embodiment, the thickness of a reflection layer is about 50 Å or less.

Also, according to an embodiment of the present invention, roughness of a layer surface can be controlled by changing a flow of an introduced carrier gas ($N_2$ or $H_2$) or $NH_3$, or controlling growth speeds of the reflection layers 34 and 35 when the reflection layers 34 and 35 formed of a compound semiconductor based on $Al_xIn_yGaN$ ($0 \leq x \leq 1$, $0 \leq y \leq 1$) are deposited.

Here, the reflection layers 34 and 35 can be formed on a lateral side along an x-axis from the substrate at the lower portion to the third semiconductor layer 26 at the upper portion. That is, the reflection layers 34 and 35 can be formed on an outer surface perpendicular to an axis of a single uneven pattern of the uneven patterns formed in the substrate.

Also, lapping and polishing can be performed on a lower portion of the substrate to make an entire thickness of the light-emitting device thin in the LED chip bar 30. The LED chip bar 30 can be separated into individual LED chips 31 through sawing.

Figure 5A:
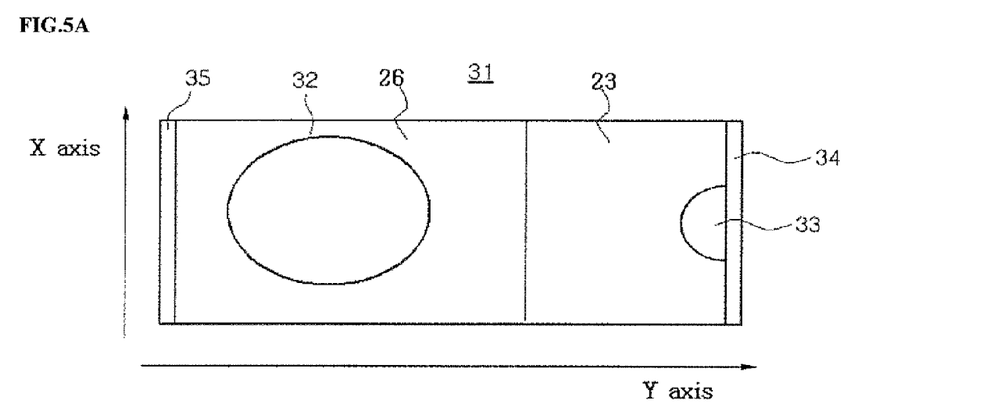
FIG. 5A is a plan view of a nitride semiconductor light-emitting device chip according to the first embodiment of the present invention.
Figure 6:
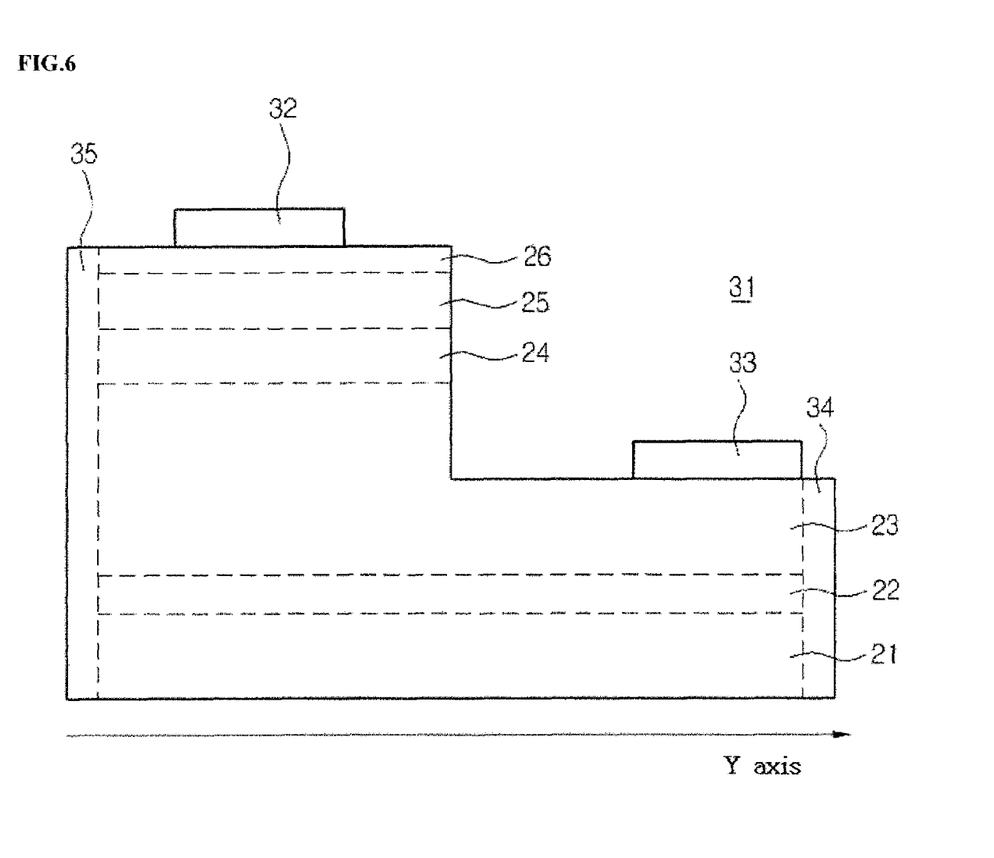
FIG. 6 is a cross-sectional view of a nitride semiconductor light-emitting device according to the first embodiment of the present invention.

FIG. 5A is a plan view of an LED chip according to the first embodiment of the present invention, and FIG. 6 is a schematic cross-sectional view of FIG. 5A.

Referring to FIGS. 5A and 6, the reflection layers 34 and 35 are formed on a lateral side of the LED chip 31 along an x-axis direction. The p-type electrode 32 is formed on the third semiconductor layer 26, and an n-type electrode 33 is formed on the first semiconductor layer 23.

According to the above-described LED chip 31, light generated by the active layer 24 is reflected from a lower portion and both sides by the surface unevenness patterns having a stripe shape formed in the substrate, and the reflection layers 34 and 35 at both sides, so that the light is emitted to the outside.

That is, these reflection layers 34 and 35 reflect a portion of light generated from the active layer 24 that propagates to a lateral side of the LED chip 31, so that light is emitted through the p-type electrode 32. Consequently, light loss to the lateral side of the LED is minimized and light emitting efficiency can be maximized.

Therefore, a problem of light emitting efficiency reduction caused by absorption of light wave-guided between the substrate and the p-type electrode can be solved.

Figure 5B:
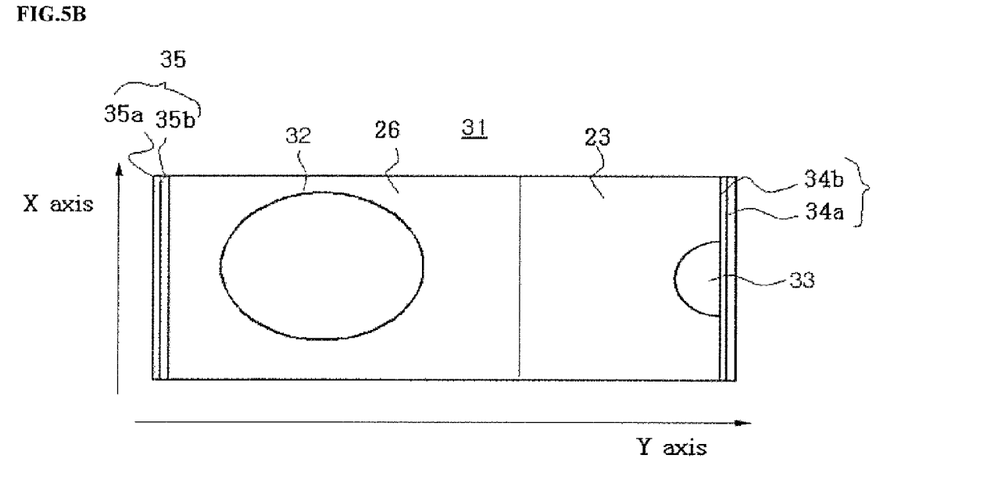
FIG. 5B is a plan view of a nitride semiconductor light-emitting device chip according to a modified first embodiment of the present invention.

FIG. 5B is a plan view of an LED chip 31 according to a modified first embodiment of the present invention. Unlike FIG. 5A, reflection layers 34 and 35 can include a plurality of layers 34a, 34b, 35a, and 35b. A reflection layer having optimum reflectance can be formed by forming the reflection layers in a plurality of layers, and controlling an appropriate thickness and the number of layers.

Second Embodiment

Figure 7:
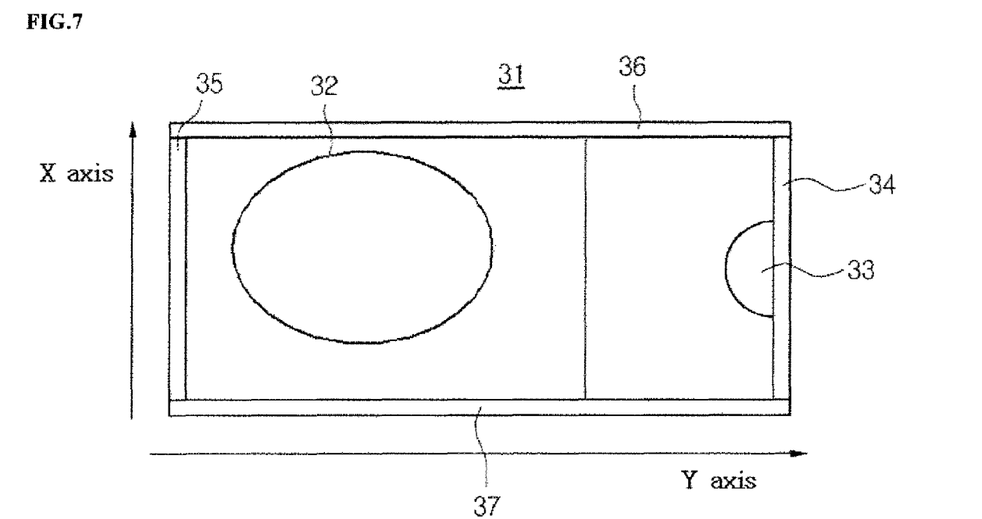
FIG. 7 is a plan view of a nitride semiconductor light-emitting device chip according to a second embodiment of the present invention.

FIG. 7 is a plan view of an LED chip according to a second embodiment of the present invention.

Referring to FIG. 7, an LED chip bar 30 is separated into a plurality of LED chips 31 as described with respect to FIG. 4. Each LED chip 31 includes a p-type electrode 32, an n-type electrode 33, and first reflection layers 34 and 35.

Second reflection layers 36 and 37 can be formed on another lateral side of the LED chip 31 where the first reflection layers 34 and 35 have not been formed. Accordingly, the first reflection layers 34 and 35 are formed on both sides of the LED chip 31 along an x-axis direction, and the second reflection layers 36 and 37 are formed on both sides of the LED chip 31 along a y-axis direction, so that a portion of light generated from the active layer 24 that propagates to the lateral sides of the LED chip 31 can be more efficiently reflected, and consequently, the light is emitted through the p-type electrode 32.

Accordingly, light loss to the lateral sides of the LED chip can be minimized and thus light emitting efficiency can be maximized.

Here, the second reflection layers 36 and 37 can be formed using a method for forming the reflection layer according to the first embodiment. For example, the second reflection layers 36 and 37 can be formed as a compound semiconductor layer based on $Al_xIn_yGaN$ ($0 \leq x \leq 1$, $0 \leq y \leq 1$) having high reflection efficiency. This can be accomplished by depositing an $Al_xIn_yGaN$ layer ($0 \leq x \leq 1$, $0 \leq y \leq 1$) and a GaN layer in turns a number of times on left/right sides of the LED chip using CVD.

Also, in the case where the second reflection layers 36 and 37 are formed using a compound semiconductor layer, desired reflectance can be obtained by controlling the thickness (about 50 Å or less) of the second reflection layers 36 and 37 and a period by which deposition is performed. Also, roughness of a layer surface can be controlled by changing a flow of an introduced carrier gas ($N_2$ or $H_2$) or $NH_3$, or controlling growth speeds of the second reflection layers 36 and 37 when the second reflection layers 36 and 37 formed of a GaN-based compound semiconductor are deposited.

Also, since the reflection layers are formed on all of peripheral surfaces of the LED chip 31 according to the second embodiment of the present invention, a substrate where stripe-shaped surface unevenness patterns are not formed can be used. Also, first reflection layers 34 and 35 that have been formed in an LED chip bar can be formed simultaneously when the second reflection layers 36 and 37 are formed.

Third Embodiment

Figure 8:
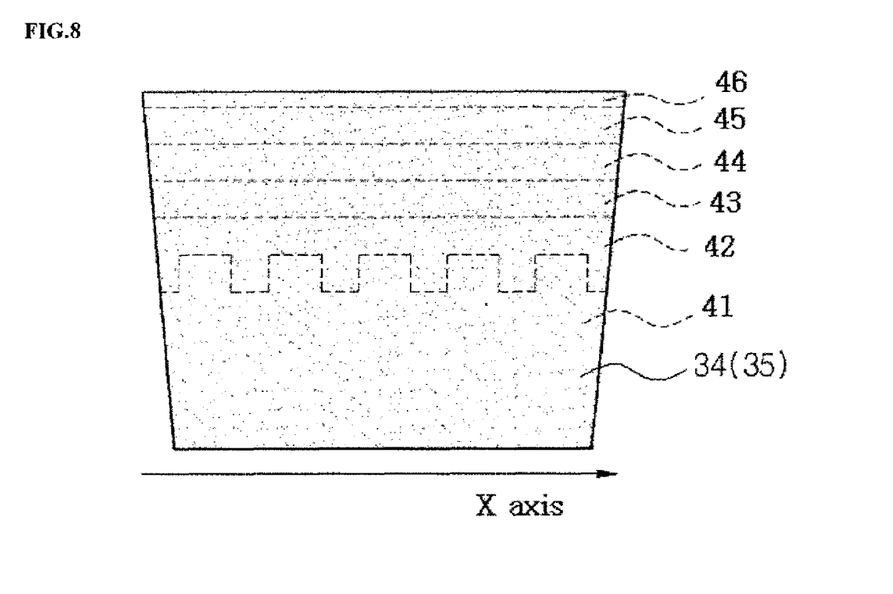
FIG. 8 is a cross-sectional view of a nitride semiconductor light-emitting device according to a third embodiment of the present invention.

FIG. 8 is a cross-sectional view of a nitride semiconductor light-emitting device according to a third embodiment of the present invention.

Referring to FIG. 8, a nitride semiconductor light-emitting device according to a third embodiment of the present invention includes a substrate 41 having stripe-shaped surface unevenness patterns, a buffer layer 42, a first semiconductor layer 43, an active layer 44, a second semiconductor layer 45, and a thin third semiconductor layer 46. A method for manufacturing the above-described nitride semiconductor light-emitting device can be performed using the method for manufacturing the nitride semiconductor light-emitting device described with reference to FIGS. 3A to 3F.

In addition, the nitride semiconductor light-emitting device can have a structure where a lateral side perpendicularly facing a direction of the surface unevenness patterns of the substrate 41 is etched at a predetermined angle. As left/right sides of the device are etched at a predetermined angle, the device is formed in a structure that is gradually widened from the substrate at the lower portion to a semiconductor layer at the upper portion of the device. A method for forming an inclined surface on a lateral side in a y-axis direction of the substrate includes wet etching, for example anisotropic wet-etching. The device can be formed to have an inclined surface at a predetermined angle, for example, in a range of about 10-80° with respect to the substrate 41.

Also, the nitride semiconductor light-emitting device illustrated in FIG. 8 can have reflection layers 34 and 35 on at least one lateral side as illustrated in FIGS. 4, 5A, and 5B.

Also, according to a fourth embodiment of the present invention, the surface on which the reflection layers 34 and 35 are formed can be formed in the above-described inclined structure.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modification in the component parts and/or arrangements, alternative uses will also be apparent to those skilled in the art.

What is claimed is:

1. A nitride semiconductor light-emitting device comprising:
   a light-emitting device chip including a first electrode and a second electrode; and
   a reflection layer on both lateral sides of the light-emitting device chip, the reflection layer comprising a first reflection layer on a first lateral side of the light-emitting device chip and a second reflection on a second lateral side of the light-emitting device chip,
   wherein the reflection layer reflects a portion of light generated from the light-emitting device chip to the top side of the light-emitting device chip,
   wherein the light is emitted through the top side of the light-emitting device chip,
   wherein the reflection layer is in contact with the both lateral sides of the light-emitting device chip, and
   wherein a top surface of the first reflection layer is adjacent to the first electrode, a top surface of the second reflection layer is adjacent to the second electrode, and the top surface of the first reflection layer is lower than the top surface of the second reflection layer,
   wherein the reflection layer comprises an $Al_xIn_yGaN$ layer ($0 \leq x \leq 1$, $0 \leq y \leq 1$) and a GaN layer, and
   wherein a lower-most surface of the first reflection layer and a lower-most surface of the second reflection layer are at a same level with a bottom surface of the light-emitting device chip.

2. The device according to claim 1, wherein the light-emitting device chip comprises a substrate including surface unevenness,
   wherein the surface unevenness comprises a stripe shape,
   wherein the stripe shape surface unevenness is formed in the substrate along an x-axis direction,
   wherein the reflection layer is formed on a lateral side of the x-axis ranging from the substrate.

3. The device according to claim 2, wherein the surface unevenness comprises a lens shape.

4. The device according to claim 2, wherein the reflection layer is formed on an outer surface perpendicular to an axis of a single uneven portion of the surface unevenness formed in the substrate.

5. The device according to claim 2, wherein the reflection layer is formed on an outer surface perpendicular to an axis of a single uneven pattern of the surface unevenness formed in the substrate.

6. The device according to claim 1, wherein the light-emitting device chip has at least one lateral side inclined at a predetermined angle.

7. The device according to claim 6, wherein the light-emitting device chip is formed in a structure that is gradually widened from a lower portion to an upper portion of the light-emitting device chip.

8. The device according to claim 1, wherein the reflection layer comprises a roughness.

9. A nitride semiconductor light-emitting device comprising:
   a light-emitting device chip including a first electrode and a second electrode; and
   a reflection layer on at least one lateral side of the light-emitting device chip, wherein the reflection layer on the at least one lateral side of the light-emitting device chip comprises a first reflection layer on a first lateral side of the light-emitting device chip and a second reflection layer on a second lateral side of the light-emitting device chip,
   wherein the reflection layer reflects light propagating to the at least one lateral side of the light-emitting device chip to the top side of the light-emitting device chip,
   wherein the light is emitted through the top side of the light-emitting device chip,
   wherein the reflection layer is in contact with the at least one lateral side of the light-emitting device chip,
   wherein a top surface of the first reflection layer is adjacent to the first electrode, a top surface of the second reflection layer is adjacent to the second electrode, and the top surface of the first reflection layer is lower than the top surface of the second reflection layer,
   wherein the reflection layer comprises an $Al_xIn_yGaN$ layer ($0 \leq x \leq 1$, $0 \leq y \leq 1$) an a GaN layer, and
   wherein a lower-most surface of the first reflection layer and a lower-most surface of the second reflection layer are at a same level with a bottom surface of the light-emitting device chip.

10. The device according to claim 9, wherein the light-emitting device chip is formed in a structure that is gradually widened from a lower portion to an upper portion of the light-emitting device chip.

11. The device according to claim 9, wherein the reflection layer comprises a roughness.

12. The device according to claim 9, wherein the substrate comprises surface unevenness comprising a stripe shape,
    wherein the stripe shape surface unevenness is formed in the substrate along an x-axis direction,
    wherein the reflection layer is formed on a lateral side of the x-axis ranging from the substrate.

13. A method for manufacturing a nitride semiconductor light-emitting device, the method comprising:
    forming a light-emitting device chip including a first electrode and a second electrode; and
    forming a first reflection layer on both lateral sides of the light-emitting device chip, wherein forming the first reflection layer on the both lateral sides comprises forming a first reflection layer portion on a first lateral side of the both lateral sides of the light-emitting device chip and a second reflection layer portion on a second lateral side of the both lateral sides of the light-emitting device chip, wherein the first reflection layer reflects a portion of light generated from the light-emitting device chip to the top side of the light-emitting device chip, wherein the light is emitted through the top side of the light-emitting device chip, wherein the first reflection layer is in contact with the both lateral sides of the light-emitting device chip, wherein a top surface of the first reflection layer portion is adjacent to the first electrode, a top surface of the second reflection layer portion is adjacent to the second electrode, and the top surface of the first reflection layer portion is lower than the top surface of the second reflection layer portion, wherein the reflection layer comprises an $Al_xIn_yGaN$ layer ($0 \leq x \leq 1$, $0 \leq y \leq 1$) an a GaN layer, and wherein a lower-most surface of the first reflection layer and a lower-most surface of the second reflection layer are at a same level with a bottom surface of the light-emitting device chip.

14. The method according to claim 13, further comprising separating the light-emitting device chip into a plurality of light-emitting device chips.

15. The method according to claim 14, further comprising forming a second reflection layer on at least one of lateral sides of the separated light-emitting device chip where the first reflection layer is not formed on.

16. The method according to claim 14, wherein the light-emitting device chip has at least one lateral side inclined at a predetermined angle.

17. The method according to claim 13, wherein during forming the first reflection layer, surface roughness of the first reflection layer is controlled by changing flow of carrier gas and precursor, or by controlling a growth speed of the first reflection layer.

18. The method according to claim 13, wherein the light-emitting device chip is formed in a structure that is gradually widened from a lower portion to an upper portion of the light-emitting device chip.

19. The method according to claim 13, wherein the reflection layer comprises a roughness.

20. The method according to claim 13, wherein the substrate comprises surface unevenness comprising a stripe shape, wherein the stripe shape surface unevenness is formed in the substrate along an x-axis direction, wherein the reflection layer is formed on a lateral side of the x-axis ranging from the substrate.

\* \* \* \* \*